United States Patent
Lee

(10) Patent No.: US 9,557,964 B2
(45) Date of Patent: Jan. 31, 2017

(54) RANDOM NUMBER GENERATOR AND METHOD FOR GENERATING RANDOM NUMBER THEREOF

(71) Applicant: Winbond Electronics Corp., Taichung (TW)

(72) Inventor: Chen-Yi Lee, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 225 days.

(21) Appl. No.: 14/549,550

(22) Filed: Nov. 21, 2014

(65) Prior Publication Data

US 2016/0147505 A1 May 26, 2016

(51) Int. Cl.

| | |
|---|---|
| *G06F 7/58* | (2006.01) |
| *H03K 3/84* | (2006.01) |
| *H03K 3/356* | (2006.01) |
| *H03K 3/03* | (2006.01) |
| *G11C 19/00* | (2006.01) |

(52) U.S. Cl.
CPC ............... *G06F 7/588* (2013.01); *G06F 7/582* (2013.01); *G06F 7/584* (2013.01); *G11C 19/00* (2013.01); *H03K 3/356* (2013.01); *H03K 3/84* (2013.01); *H03K 3/0315* (2013.01)

(58) Field of Classification Search
CPC .............................................. G06F 7/58–7/584
USPC .................................................. 708/250–252
See application file for complete search history.

(56) References Cited

U.S. PATENT DOCUMENTS

| | | | |
|---|---|---|---|
| 4,837,790 A | 6/1989 | Harada | |
| 8,131,789 B2 * | 3/2012 | Vergnes | .................. G06F 7/588 708/251 |
| 8,583,711 B2 | 11/2013 | Hars | |
| 2002/0156819 A1 * | 10/2002 | Oerlemans | ............ H04L 9/0861 708/252 |
| 2002/0186086 A1 * | 12/2002 | Curiger | ..................... H03K 3/84 331/78 |
| 2006/0244544 A1 * | 11/2006 | Suzuki | ................. H03K 3/0315 331/57 |

(Continued)

FOREIGN PATENT DOCUMENTS

| | | |
|---|---|---|
| JP | S63107312 | 5/1988 |
| JP | 2006294001 | 10/2006 |

(Continued)

OTHER PUBLICATIONS

"Office Action of Japan Counterpart Application", issued on May 10, 2016, p. 1-p. 4.

*Primary Examiner* — Matthew Sandifer
(74) *Attorney, Agent, or Firm* — Jianq Chyun IP Office

(57) ABSTRACT

A random number generator and a method for generating random number thereof are provided. The random number generator is used for generating a random sequence and includes a linear-feedback shift register (LFSR) circuit, an oscillating circuit, a delay circuit and a logic operation circuit. The LFSR circuit receives the random sequence to generate a plurality of first control signals and a plurality of second control signals. The oscillating circuit receives the first control signals to generate a random clock signal. The delay circuit receives an alternating current signal and the second control signals to generate a random delay sampling signal. The logic operation circuit receives the random clock signal and the random delay signal to generate the random sequence.

12 Claims, 3 Drawing Sheets

(56) References Cited

U.S. PATENT DOCUMENTS

2009/0172055 A1* 7/2009 Radja .................. G06F 7/588
708/251
2012/0303690 A1 11/2012 Fukushima et al.

FOREIGN PATENT DOCUMENTS

| WO | 9743709 | 11/1997 |
| WO | 2009109959 | 9/2009 |

* cited by examiner

RANDOM NUMBER GENERATOR AND METHOD FOR GENERATING RANDOM NUMBER THEREOF

BACKGROUND OF THE INVENTION

1. Field of the Invention

The invention relates to a number generator, and particularly relates to a random number generator and a method for generating random numbers thereof.

2. Description of Related Art

In the information society and the era of globalization, human beings are becoming more and more inseparable from computers and the Internet. As a result, the application of electronic transactions also becomes more convenient and popular. To improve the security of electronic transactions, using random codes to encrypt and decrypt the record of each transaction is common nowadays.

Generally speaking, a random sequence is generated by using a random number generator, and the desired random code is thus obtained by using the random sequence. In addition, the randomness of the random codes is determined by the non-repeatability of the random codes, and the randomness of the random codes determines the chance that the random codes are deciphered. Thus, how to increase the randomness of the random codes becomes a main topic in designing a random number generator.

SUMMARY OF THE INVENTION

The invention provides a random number generator and a method for generating random numbers thereof capable of increasing randomness of a random sequence. In other words, randomness of random codes is increased.

A random number generator according to the invention is configured to generate a random sequence and includes a linear-feedback shift register circuit, an oscillating circuit, a delay circuit, and a logic operation circuit. The linear-feedback shift register circuit receives the random sequence to generate a plurality of first control signals and a plurality of second control signals. The oscillating circuit receives the first control signals to generate a random clock signal. The delay circuit receives an alternating current signal and the second control signals to generate a random delay sampling signal. The logic operation circuit receives the random clock signal and the random delay sampling signal, so as to capture a logic level of the random clock signal based on the random delay sampling signal, and determines a logic level of an output end of the logic operation circuit based on the logic level of the random clock signal that is captured, thereby forming the random sequence.

A method for generating random numbers of a random number generator according to the invention is configured for generating a random sequence and includes steps as follows. The random sequence is received by a linear-feedback shift register circuit to generate a plurality of first control signals and a plurality of second control signals. The first control signals are received by an oscillating circuit to generate a random clock signal. An alternating current signal and the second control signals are received by a delay circuit to generate a random delay sampling signal. The random clock signal and the random delay sampling signal are received by a logic operation circuit, so as to capture a logic level of the random clock signal based on the random delay sampling signal, wherein the logic operation circuit determines a logic level of an output end of the logic operation circuit based on the logic level of the random clock signal that is captured, thereby forming the random sequence.

Based on the above, in the random number generator and the method for generating random numbers thereof, the random sequence generated is fed back to generate the first and second control signals having randomness, then the oscillating circuit is controlled based on the first control signals to generate the random clock signal and a delay time for the delay circuit delaying the alternating current signal is controlled based on the second control signals. In this way, the randomness of the random sequence may be improved. Namely, randomness of random codes may be improved.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
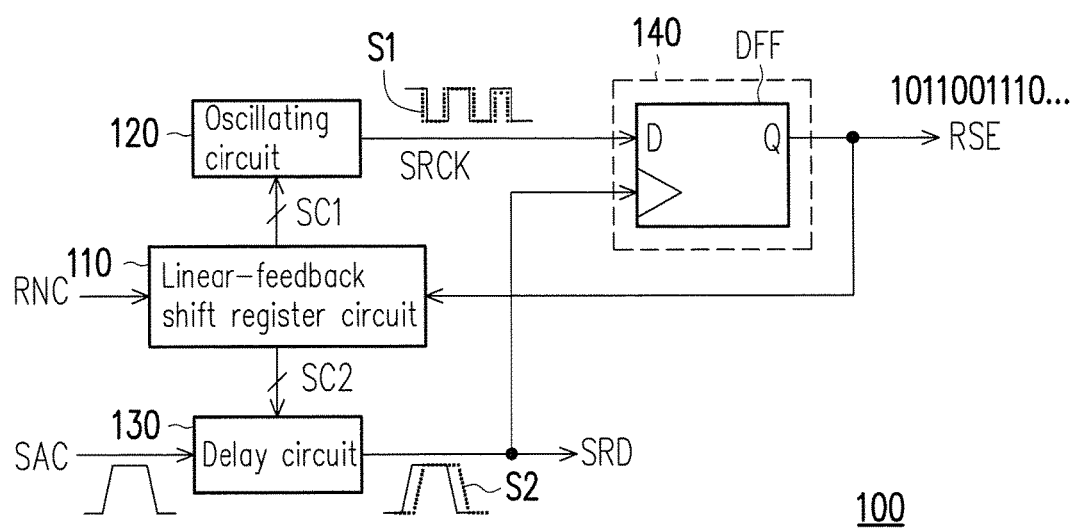
FIG. 1 is a schematic view illustrating a system of a random number generator according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic view illustrating a system of a random number generator according to an embodiment of the invention. Referring to FIG. 1, in this embodiment, a random number generator 100 is configured to generate a random sequence RSE, and includes a linear-feedback shift register (LFSR) circuit 110, an oscillating circuit 120, a delay circuit 130, and a logic operation circuit 140. In addition, the logic operation circuit 140 includes a D flip-flop DFF, for example.

In this embodiment, the linear-feedback shift register circuit 110 receives a control signal RNC and the random sequence RSE. When the linear-feedback shift register circuit 110 is activated under the control of the control signal RNC, the linear-feedback shift register circuit 110 generates a plurality of first control signals SC1 and a plurality of second control signals SC2 based on the random sequence RSE.

The oscillating circuit 120 receives the first control signals SC1 to generate a random clock signal SRCK based on the first control signals SC1. In addition, a pulse width of the random clock signal SRCK is controlled by and varied in correspondence with variation of a voltage level of the first control signals SC1, as shown in a dotted waveform S1. The delay circuit 130 receives an alternating current signal SAC (e.g. a square wave) and the second control signals SC2 to generate a random delay sampling signal SRD by delaying the alternating current signal SAC according to the second control signals SC2. In addition, delay time of the alternating current signal SAC is controlled by and varied in accordance with variation of a voltage level of the second control signals SC2, as shown in a dotted waveform S2. In other words, the alternating current signal SAC may jitter in correspondence with the voltage level of the second control signals SC2 to serve as the random delay sampling signal SRD.

An input end D of the D flip-flop DFF of the logic operation circuit 140 receives the random clock signal SRCK, and a trigger end of the D flip-flop DFF receives the random delay sampling signal SRD. The D flip-flop DFF captures a logic level of the random clock signal SRCK according to the random delay sampling signal SRD. In addition, the logic level of the random clock signal SRCK that is captured determines a logic level of an output end Q of the logic operation circuit 140, so as to form the random sequence RSE.

Based on the above, since the random sequence RSE is fed back to generate the first control signals SC1 and the second control signals SC2, randomness of the random sequence RSE itself may indirectly influence randomness of the first control signals SC1 and randomness of the second control signals SC2, so as to randomly adjust or set the pulse width of the random clock signal SRCK and the delay time of the alternating current signal SAC, thereby increasing the randomness of the random sequence RSE.

In an embodiment of the invention, the first control signals SC1 may be partially identical to the second control signals SC2, i.e. a part of the first control signals SC1 may be completely identical to a part of the second control signals SC2; the first control signals SC1 may be completely identical to the second control signals SC2; or, the first control signals SC1 may be completely different from the second control signals SC2.

In this embodiment, the logic operation circuit 140 includes the D flip-flop DFF, for example. However, in other embodiments, the logic operation circuit 140 may include a T flip-flop, for example, to generate the random sequence RSE according to the random delay sampling signal SRD and the random clock signal SRCK. In addition, the alternating current signal SAC is shown as a square wave for an illustrative purpose. However, in other embodiments, alternating current signal SAC may be one of a sine wave signal, a triangular wave signal, a square wave signal, or a saw tooth wave signal.

Figure 2:
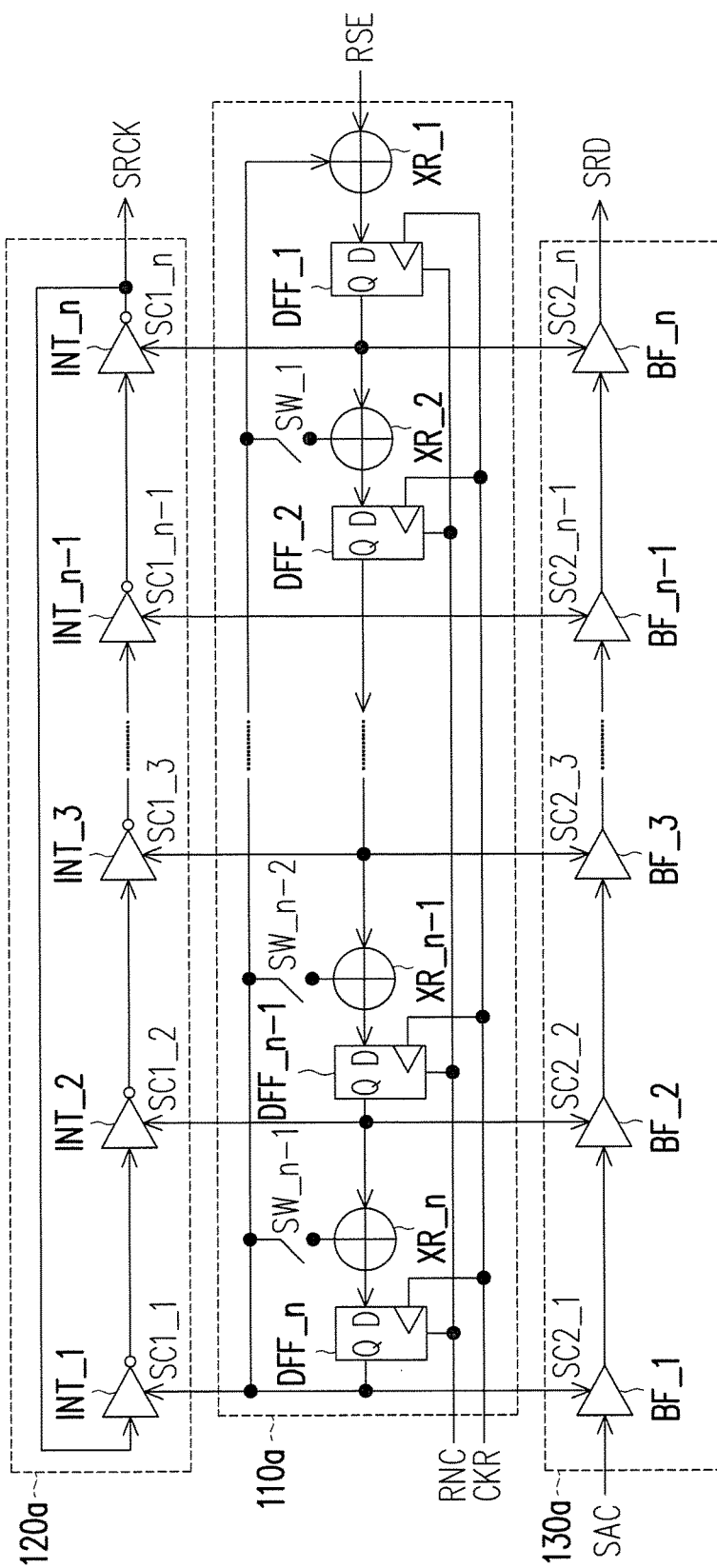
FIG. 2 is a schematic circuit view illustrating an oscillating circuit, a linear-feedback shift register circuit, and a delay circuit according to an embodiment of the invention.

FIG. 2 is a schematic circuit view illustrating an oscillating circuit, a linear-feedback shift register circuit, and a delay circuit according to an embodiment of the invention. Referring to FIGS. 1 and 2 together, it should be noted that like or similar components are referred to with like or similar reference numerals. In this embodiment, it is set that the first control signals SC1 are completely identical to the second control signals SC2.

A linear-feedback shift register circuit 110a includes a plurality of flip-flops, such as D flip-flops DFF_1 to DFF_n, a plurality of logic operation elements, such as XOR gates XR_1 to XR_n, and a plurality of switches SW_1 to SW_n−1, for example. In addition, the switches SW_1 to SW_n−1 being turned on or turned off may be determined by people having ordinary skills in the art, and the embodiments of the invention are not limited thereto.

The output ends Q (corresponding to logic output ends) of the D flip-flops DFF_1 to DFF_n provide the first control signals SC1_1 to SC1_n and the second control signals SC2_1 to SC2_n, and are coupled to operation input ends of the next XOR gates, such as XR_2 to XR_n, reset ends of the D flip-flops DFF_1 to DFF_n receive the control signal RNC, the trigger ends of the D flip-flops DFF_1 to DFF_n jointly receive the reference clock signal CKR, and input ends D (corresponding to logic input ends) of the D flip-flops DFF_1 to DFF_n are coupled to operation output ends of the previous XOR gates, such as XOR gates XR_1 to XR_n.

For example, the input end D of the D flip-flop DFF_1 is coupled to the operation output end of the XOR gate XR_1, and the input end D of the D flip-flop DFF_2 is coupled to the operation output end of the XOR gate XR_2, and so on so forth. In other words, the operation output end of the $i^{th}$ XOR gate (e.g. XR_1 to XR_n) is coupled to the input end D of the $i^{th}$ D flip-flop (e.g. DFF_1 to DFF_n). In addition, i is a positive integer greater than or equal to 1. Moreover, the output end Q of the D flip-flop DFF_1 is coupled to the operation input end of the XOR gate XOR_2, and the output end Q of the D flip-flop DFF_2 is coupled to the operation input end of the XOR gate XR_3, and so on so forth. In other words, the output end Q of the $i^{th}$ D flip-flop (e.g. DFF_1 to DFF_n) is coupled to a first operation input end of the $i+1^{th}$ XOR gate (e.g. XR_2 to XR_n).

The first operation input end of the first XOR gate XR_1 receives the random sequence RSE, and a second operation input end of the first XOR gate XR_1 is coupled to the output end of the last D flip-flop DFF_n. The switches SW_1 to SW_n−1 are respectively coupled between a second operation input end of one of the XOR gates (e.g. XR_2 to XR_n) except the first XOR gate XR_1 and the output end Q of the last D flip-flop DFF_n. In other words, the switch SW_1 is coupled between the second operation input end of the XOR gate XR_2 and the output end Q of the last D flip-flop DFF_n, the switch SW_2 is coupled between the second operation input end of the XOR gate XR_3 and the output end Q of the last D flip-flop DFF_n, and so on so forth.

Based on the above, the first control signals SC1 and the second control signals SC2 provided by the linear-feedback shift register circuit 110a not only relate to a turn-on status of the switches SW_1 to SW_n−1 but also relate to the random sequence RSE, making switching of the voltage levels of the first control signals SC1 and the second control signals SC2 not periodical.

Besides, although the D flip-flop is used as the flip-flop element as an example, the flip-flop element may also be a T flip-flop in other embodiments. Moreover, although the XOR gate is used as the logic operation element as an example, the logic operation element may be an AND gate and an OR gate in other embodiments.

Referring to FIGS. 1 and 2 again, a delay circuit 130a includes a plurality of first signal buffering elements (e.g. a plurality of buffers BF_1 to BF_n), for example. The buffer elements BF_1 to BF_n are serially connected to each other and each receives one of the first control signals (e.g. SC1_1 to SC1_n) as an operational voltage.

In addition, an input end of the first buffer BF_1 receives the alternating current signal SAC, and an output end of the last buffer BF_n provides the random delay sampling signal SRD. In addition, although the buffers BF_1 to BF_n are used as the first signal buffering elements as an example, the first signal buffering element may be an inverter or a combination of an inverter and a buffer. In other words, the first signal buffering element may be one of an inverter and a buffer. However, the invention is not limited thereto.

The oscillating circuit 120 includes a plurality of second signal buffering elements (e.g. a plurality of inverters INT_1 to INT_n), for example. Namely, the oscillating circuit 120 may be a ring oscillator. The inverters INT_1 to INT_n are serially connected to each other and each receives one of the second control signals (e.g. SC2_1 to SC2_n) as an operational voltage. In addition, an output end of the last inverter INT_n provides the random clock signal SRCK. Moreover, although the inverters INT_1 to INT_n are used as the second signal buffering elements as an example, the second signal buffering element may a combination of an inverter and a buffer, which form an oscillating circuit having a signal inverting capability in other embodiments. In other words, the second signal buffering element may be an inverter and a buffer respectively.

In addition, the first control signals SC1 are set to be completely identical to the second control signals SC2 in the embodiment described herein, so the numbers of the flip-flop elements and logic operation elements may be the same as the numbers of the first and second signal buffering elements. However, in other embodiments, the numbers of the flip-flops and the logic operation elements may be greater than the numbers of the first and second signal buffering elements. Under the circumstance that the first control signals SC1 are partially identical to the second control signals SC2, the numbers of the flip-flop elements and the logic operation elements are greater than or equal to the total of the numbers of the first signal buffering elements and the second signal buffering elements with the number of overlapped control signals reduced. Under the circumstance that the first control signals SC1 are completely different the second control signals SC2, the numbers of the flip-flop elements and the logic operation elements are greater than or equal to the total of the numbers of the first signal buffering elements and the second signal buffering elements.

Moreover, the output end of each of the flip-flop elements may provide the first control signal SC1 or the second control signal SC2, or provide the first control signal SC1 and the second control signal SC2 at the same time, depending on the setting made by people having ordinary skills in the art. The embodiments of the invention are not limited thereto.

Figure 3:
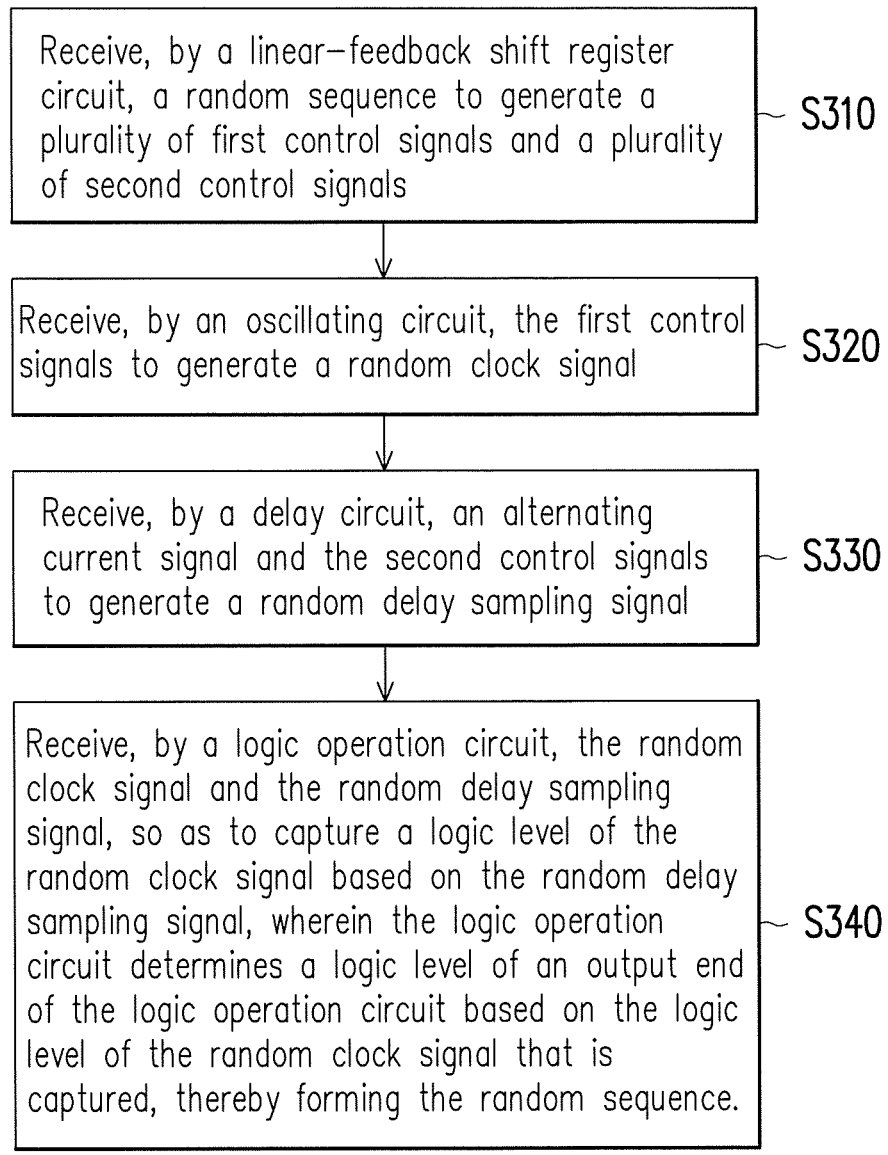
FIG. 3 is a flowchart illustrating a method for generating random numbers of a random number generator according to an embodiment of the invention.

FIG. 3 is a flowchart illustrating a method for generating random numbers of a random number generator according to an embodiment of the invention. Referring to FIG. 3, the method for generating random numbers of the random number generator includes steps as follows. A random sequence is received by a linear-feedback shift register circuit to generate a plurality of first control signals and a plurality of second control signals (Step S310). In addition, the first control signals are received by an oscillating circuit to generate a random clock signal (Step S320), and an alternating current signal and the second control signals are received by a delay circuit to generate a random delay sampling signal (Step S330). Lastly, the random clock signal and the random delay sampling signal are received by a logic operation circuit, so as to capture a logic level of the random clock signal based on the random delay sampling signal. In addition, a logic level of an output end of the logic operation circuit is determined by the logic operation circuit based on the logic level of the random clock signal that is captured, so as to form the random sequence SCE (Step S340). A sequence of Steps S310, S320, S330, and S340 is described herein for an illustrative purpose. The embodiments of the invention are not limited thereto. In addition, details regarding Steps S310, S320, S330, and S340 may be referred to the embodiments shown in FIGS. 1 and 2. Therefore, no further details will be described hereinafter.

In view of the foregoing, in the random number generator and the method for generating random numbers thereof, the random sequence generated is fed back to generate the first and second control signals having randomness, then the oscillating circuit is controlled based on the first control signals to generate the random clock signal and a delay time for the delay circuit delaying the alternating current signal is controlled based on the second control signals. In this way, the randomness of the random sequence and random codes may be improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A random number generator for generating a random sequence, comprising:
   a linear-feedback shift register circuit, receiving the random sequence to generate a plurality of first control signals and a plurality of second control signals;
   an oscillating circuit, receiving the first control signals to generate a random clock signal;
   a delay circuit, receiving an alternating current signal and the second control signals to generate a random delay sampling signal; and
   a logic operation circuit, receiving the random clock signal and the random delay sampling signal, so as to capture a logic level of the random clock signal based on the random delay sampling signal, and determining a logic level of an output end of the logic operation circuit based on the logic level of the random clock signal that is captured, thereby forming the random sequence,
   wherein the linear-feedback shift register circuit comprises:
      a plurality of flip-flop elements, each having a logic input end and a logic output end, wherein the logic output ends of the flip-flop elements are configured to provide the first control signals and the second control signals;
      a plurality of logic operation elements, each having a first operation input end, a second operation input end, and an operation output end, wherein the first operation input end of the first logic operation element of the logic operation elements receives the random sequence, the second operation input end of the first logic operation element is coupled to the logic output end of the last flip-flop element of the flip-flop elements, and the operation output end of the $i^{th}$ logic operation element is coupled to the logic input end of the $i^{th}$ flip-flop element of the flip-flop elements, the logic output end of the $i^{th}$ flip-flop element of the flip-flop elements is coupled to the first operation input end of the $i+1^{th}$ logic operation element of the logic operation elements, and i is a positive integer greater than or equal to 1; and
      a plurality of switches, respectively coupled between the second operation input end of one of remaining of the logic operation elements except the first logic operation element and the logic output end of the last flip-flop element of the flip-flop elements.

2. The random number generator as claimed in claim 1, wherein the flip-flop elements are a plurality of D flip-flops or a plurality of T flip-flops.

3. The random number generator as claimed in claim 1, wherein the logic operation elements are respectively AND gate, OR gate, or XOR gate.

4. The random number generator as claimed in claim 1, wherein the delay circuit comprises:
a plurality of first signal buffering elements, serially connected to each other and each receiving one of the second control signals, wherein an input end of the $1^{st}$ first signal buffering element of the first signal buffering elements receives the alternating current signal, an output end of the last first signal buffering element of the first signal buffering elements provides the random delay sampling signal.

5. The random number generator as claimed in claim 4, wherein the first signal buffering elements are respectively one of an inverter and a buffer.

6. The random number generator as claimed in claim 1, wherein the oscillating circuit comprises:
a plurality of second signal buffering elements, serially connected to each other and each receiving one of the first control signals, wherein an output end of one of the second signal buffering elements provides the random clock signal.

7. The random number generator as claimed in claim 6, wherein the second signal buffering elements are respectively one of an inverter and a buffer.

8. A method for generating random numbers of a random number generator, configured for generating a random sequence, the method comprising:
receiving, by a linear-feedback shift register circuit, the random sequence to generate a plurality of first control signals and a plurality of second control signals;
receiving, by an oscillating circuit, the first control signals to generate a random clock signal;
receiving, by a delay circuit, an alternating current signal and the second control signals to generate a random delay sampling signal; and
receiving, by a logic operation circuit, the random clock signal and the random delay sampling signal, so as to capture a logic level of the random clock signal based on the random delay sampling signal, wherein the logic operation circuit determines a logic level of an output end of the logic operation circuit based on the logic level of the random clock signal that is captured, thereby forming the random sequence,
wherein the linear-feedback shift register circuit comprises:
a plurality of flip-flop elements, each having a logic input end and a logic output end, wherein the logic output ends of the flip-flop elements are configured to provide the first control signals and the second control signals;
a plurality of logic operation elements, each having a first operation input end, a second operation input end, and an operation output end, wherein the first operation input end of the first logic operation element of the logic operation elements receives the random sequence, the second operation input end of the first logic operation element is coupled to the logic output end of the last flip-flop element of the flip-flop elements, and the operation output end of the $i^{th}$ logic operation element is coupled to the logic input end of the $i^{th}$ flip-flop element of the flip-flop elements, the logic output end of the $i^{th}$ flip-flop element of the flip-flop elements is coupled to the first operation input end of the $i+1^{th}$ logic operation element of the logic operation elements, and i is a positive integer greater than or equal to 1; and
a plurality of switches, respectively coupled between the second operation input end of one of remaining of the logic operation elements except the first logic operation element and the logic output end of the last flip-flop element of the flip-flop elements.

9. The method for generating random numbers of the random number generator as claimed in claim 8, wherein a part of the first control signals are completely identical to a part of the second control signals.

10. The method for generating random numbers of the random number generator as claimed in claim 9, wherein the first control signals are completely identical to the second control signals.

11. The method for generating random numbers of the random number generator as claimed in claim 8, wherein the first control signals are completely different from the second control signals.

12. The method for generating random numbers of the random number generator as claimed in claim 8, wherein the alternating current signal is one of a sine wave signal, a triangular wave signal, a square wave signal, or a saw tooth wave signal.

\* \* \* \* \*